United States Patent [19]
Adachi et al.

[11] Patent Number: 5,361,228
[45] Date of Patent: Nov. 1, 1994

[54] IC MEMORY CARD SYSTEM HAVING A COMMON DATA AND ADDRESS BUS

[75] Inventors: Kaoru Adachi; Katsuya Makioka, both of Tokyo, Japan

[73] Assignee: Fuji Photo Film Co., Ltd., Kanagawa, Japan

[21] Appl. No.: 54,575

[22] Filed: Apr. 30, 1993

[30] Foreign Application Priority Data

Apr. 30, 1992 [JP] Japan ............................ 4-111328
May 15, 1992 [JP] Japan ............................ 4-123270

[51] Int. Cl.$^5$ ........................... G11C 7/00; G11C 8/00
[52] U.S. Cl. ........................... 365/189.03; 365/189.9; 365/230.01; 365/230.03
[58] Field of Search ............. 365/52, 63, 72, 189.1, 365/189.2, 189.3, 189.5, 230.2, 230.3, 230.1; 358/909; 395/425

[56] References Cited
U.S. PATENT DOCUMENTS

| | | | |
|---|---|---|---|
| 5,018,017 | 5/1991 | Sasaki | 358/909 |
| 5,091,787 | 2/1992 | Watanabe | 358/909 |
| 5,124,589 | 6/1992 | Shiomi | 365/189.5 X |
| 5,249,160 | 9/1993 | Wu | 365/230.8 |

FOREIGN PATENT DOCUMENTS 62-177695 8/1987 Japan .
1-7287 1/1989 Japan .

*Primary Examiner*—Eugene R. LaRoche
*Assistant Examiner*—Son Mai
*Attorney, Agent, or Firm*—Birch, Stewart, Kolasch & Birch

[57] ABSTRACT

An IC memory card system has a host for processing data, and an IC memory card removably connected to the host and incorporating a data recording medium implemented by an electrically erasable programmable semiconductor memory. The host comprises a system controller for sending to the memory card an address-/data signal for distinguishing an address and data by a logical bilevel state, a read/write signal for distinguishing reading of data and writing of data in the semiconductor memory by a logical bilevel state, and an erase signal for erasing data stored in the semiconductor memory by a logical bilevel state as control signals, and bus clock pulses each being synchronous to a particular address and particular data. The IC memory card comprises a control circuit responsive to the address/data signal, read/write signal, erase signal and bus clock pulses for distinguishing an address and data, distinguishing reading and writing, and determining whether or not to erase existing data, and then reading or writing data in the semiconductor memory or erasing the existing data.

15 Claims, 12 Drawing Sheets

Fig. 2

| No. | SIGNAL | I/O | FUNCTION |
|---|---|---|---|
| 1 | GND | I | GROUND |
| 2 | D0 | I/O | BIDIRECTIONAL DATA BUS (LSB) |
| 3 | D1 | I/O | ⁎ |
| 4 | D2 | I/O | ⁎ |
| 5 | D3 | I/O | ⁎ |
| 6 | D4 | I/O | ⁎ |
| 7 | D5 | I/O | ⁎ |
| 8 | D6 | I/O | ⁎ |
| 9 | D7 | I/O | BIDIRECTIONAL DATA BUS (MSB) |
| 10 | Vcc | I | +5V |
| 11 | Vpp | I | +12V |
| 12 | RDY/-BSY | O | CARD READY/BUSY |
| 13 | CE | I | CARD ENABLE |
| 14 | -A/D(A0) | I | ADDRESS/DATA |
| 15 | R/-W(A1) | I | READ/WRITE |
| 16 | BCK(RD) | I | BUS CLOCK |
| 17 | ES(WR) | I | CLUSTER ERASE |
| 18 | RFU | NC | RESERVE |
| 19 | RFU | NC | RESERVE |
| 20 | GND | I | GROUND |

Fig. 3

| -A/D | R/-W | ES | FUNCTION |
|---|---|---|---|
| 0 | 0 | 0 | ADDRESS SET MODE |
| 1 | 0 | 0 | DATA WRITE MODE |
| 1 | 1 | 0 | DATA READ MODE |
| 1 | 0 | 1 | ERASE MODE |

Fig. 7

| -A/D | R/-W | MODE |
|---|---|---|
| 0 | 0 | ADDRESS SET MODE (4 BYTES) |
| 0 | 1 | STATUS SIGNAL READ MODE (STATUS, FLAG & CURRENT ADDRESS) |
| 1 | 0 | DATA WRITE MODE |
| 1 | 1 | DATA READ MODE |

IC MEMORY CARD SYSTEM HAVING A COMMON DATA AND ADDRESS BUS

BACKGROUND OF THE INVENTION

1. Field of the Invention

The present invention relates to an IC (Integrated Circuit) memory card for storing image data, character data or similar data and, more particularly, to an IC memory card system using an IC memory card incorporating an SRAM (Static Random Access Memory), EEPROM (Electrically Erasable Programmable Read Only Memory) or similar semiconductor memory. The present invention is also concerned with such an IC memory card and a data inputting and outputting system applicable to the IC memory card system.

2. Description of the Related Art

Today, it is a common practice with a digital electronic still camera or similar imaging apparatus to store image data representative of shots or pictures in an IC memory card incorporating a semiconductor memory. While an SRAM has been predominant as an IC memory for the above application, an EEPROM is also attracting attention due to, among others, the inherently low cost thereof. Preferably, therefore, a digital electronic still camera should be provided with an interface capable of accommodating both of a memory card with an SRAM and a memory card with an EEPROM, as needed.

An interface having the above-stated capability may be implemented as an interface connector having twenty pins, as proposed by Japan Electronic Industry Development Association (JEIDA) in "IC MEMORY GUIDELINE", 3rd Edition. According to this GUIDELINE, when the input and output of data from the IC memory card is implemented by an 8-bit parallel transfer bus, the interface connector is provided with eight data terminals. Then, not only data to be written to or read out of a memory chip but also an address designating the address location of the data in the memory card are applied to the eight data terminals. The address and the data are distinguished from each other by the logical states of two state terminals. When the address designating the address location of the memory chip is made up of a plurality of bytes, each byte is indicated by a particular combination of the logical states of the state terminals. For example, assuming an IC memory card using an SRAM whose capacity exceeds sixty-four kilobytes, the address is made up of three bytes. Then, the state terminals are indicative of the lower one of the three bytes to be read when both are in a low level, the middle one of the three bytes when one state terminal is in a low level and the other state terminal is in a high level, and the higher one of the three bytes when the former is in a high level and the latter is in a low level. Further, when both of the two state terminals are in a high level, they are indicative of reading or writing of data. The reading and writing of data are distinguished from each other by the logical state of a read terminal and that of a write terminal provided independently of the state terminals. Specifically, data are read out when the read terminal goes high or data are written in when the write terminal goes high. The memory card writes or reads data in or out of the memory chip in response to control signals sent from an electronic still camera or similar host to such control terminals. When the read terminal is in a high level and both of the state terminals are in a low level, a status representative of the kind, capacity and so forth of the memory chip and a flag representing the instantaneous control condition of the card are read out of the card.

The conventional IC memory card with the above-described type of interface connector is provided with a control circuit for controlling the writing and reading of data out of the memory chip. When the memory card is removably loaded on a camera or similar host, the control circuit reads the status of the card to inform the host of the adaptability of the card and, on receiving an address made up of a plurality of bytes from the host, designates a corresponding address location of the memory chip. Subsequently, as the host sends a timing clock signal to a clock terminal also included in the connector, the control circuit sequentially increments the address to read data out of the memory chip or to write data therein.

However, the conventional IC memory card system has the following problem. Since the interface connector has only twenty pins as input/output terminals, an extra function cannot be added to the memory card unless one or more of the pins is exclusively allocated thereto. On the other hand, only four different states, including the writing of data, are available with the two state terminals of such a connector. Hence, when the address is made up of four or more bytes, i.e., when the storage capacity of the memory chip exceeds sixty-four kilobytes, an extra terminal for receiving a state signal is required. It follows that the conventional data inputting and outputting system is not practical when it is desired to add an extra function and increase the storage capacity.

In the light of the above, Japanese Patent Application No. 257380/1990 discloses an IC memory card capable of distinguishing all of the expected states with an address/data terminal distinguishing an address and data by a logical bilevel state (high or low), a read/write terminal distinguishing writing and reading by a bilevel state, and a bus clock terminal synchronous to an address or data on a byte basis, and capable of setting an address with no regard to the number of bytes. However, the problem with this type of memory card is that, when implemented by an EEPROM, it has to make a decision on the erasure of data and generate an erase signal within itself. The memory card, therefore, needs complicated control circuitry and cannot operate at high speed, compared to a memory card using an SRAM.

Moreover, assume that an error occurs while data are being sequentially written to the IC memory card having the above-mentioned three terminals or to any other conventional memory card. Then, the host cannot accurately locate the address of the memory card where the error has occurred, i.e., determine up to which address data have been written. The host, therefore, has to write the data all over again or has to start writing data again at or around the address in question on the basis of the content of a counter built therein and synchronous to a counter incorporated in the memory card. However, since the counter built in the host, or system, and the actual write address of the card often fail to coincide due to noise or similar cause, causing the system to count the address in synchronism with the card is not efficient. Particularly, when the storage capacity of the memory card and, therefore, the number of addresses is increased, the counter incorporated in the system would need to be scaled up and this would complicate the circuitry and increase the cost.

SUMMARY OF THE INVENTION

It is, therefore, an object of the present invention to provide an IC memory card system which allows an IC memory card to accommodate an extra function without resorting to a greater number of terminals than the conventional one and to read even an address made up of four or more bytes.

It is another object of the present invention to provide an IC memory card system which simplifies the construction of an IC memory card implemented by an EEPROM and allows it to operate at high speed.

It is another object of the present invention to provide an IC memory card system which allows, when a write error or similar error occurs in an IC memory card, a host connected to the memory card to see the address location in question without increasing the load on the host.

In accordance with the present invention, an IC memory card system comprises a host for processing data, and an IC memory card removably connected to the host and incorporating a data recording medium implemented by an electrically erasable programmable semiconductor memory. The host has a system controller for sending to the memory card an address/data signal for distinguishing an address and data by a logical bilevel state, a read/write signal for distinguishing reading of data and writing of data in the semiconductor memory by a logical bilevel state, an erase signal for erasing data stored in the semiconductor memory by a logical bilevel state as control signals, and bus clock pulses each being synchronous to a particular address and particular data. The memory card has a control circuit responsive to the address/data signal, read/write signal, erase signal and bus clock pulses for distinguishing an address and data, for distinguishing reading and writing, for determining whether or not to erase existing data, and then reading or writing data in the semiconductor memory or for erasing the existing data.

Also, in accordance with the present invention, an IC memory card comprises a storage implemented by a semiconductor memory for storing data, a control circuit for selectively writing or reading data in or out of the storage, and an inputting and outputting circuit for removably connecting the control circuit to a host. The inputting and outputting circuit comprises: a common data terminal to which the host selectively sends an address for accessing the storage and input or output data, or a number of blocks of the storage to erase, an address/data terminal to which the host sends a bilevel signal for distinguishing the address and data and the number of blocks to erase to be applied to the common data terminal, a read/write terminal to which the host sends a bilevel signal for distinguishing reading of data and writing of data, an erase terminal to which the host sends a bilevel signal indicative of erasure of data, and a bus clock input terminal to which the host sends bus clock pulses, each being synchronous to a particular address, particular data or the number of blocks to erase.

Further, in accordance with the present invention, a method of inputting and outputting data from an IC memory card incorporating a semiconductor memory which receives an address to access and data to record over a common bus and, before the data are written to the semiconductor memory, has data existing therein erased comprises the steps of: (1) sending (from a host to the IC memory card) an address/data signal (for distinguishing an address and data by a logical bilevel state), a read/write signal (for distinguishing reading of data and writing of data in the semiconductor memory by a logical bilevel state), an erase signal (for erasing data existing in the semiconductor memory by a logical bilevel state), control signals, and bus clock pulses (each being synchronous to a particular address and particular data), and (2) writing or reading data in or out of the semiconductor memory or erasing data of the semiconductor memory by distinguishing an address and data, distinguishing writing of data and reading of data and determining whether or not to erase data on the basis of the bilevel states of the address/data signal, read/write signal and erase signal and the bus clock pulses.

Moreover, in accordance with the present invention, an IC memory card system comprises a host for processing data, and an IC memory card incorporating a semiconductor memory therein and removably connected to the host for selectively writing or reading, on receiving an address made up of a plurality of blocks from the host, data in or out of the semiconductor memory by sequentially incrementing the address within the IC memory card. The IC memory card comprises a plurality of address counters, each for storing one of the plurality of blocks constituting the address received from the host, and for accessing the semiconductor memory by sequentially incrementing the block; a control circuit for controlling writing or reading of data on receiving control signals for writing or reading data or control signals for setting an address from the host; and a selector for selectively sending to the host the address from the plurality of address counters or the data read out of the semiconductor memory. The host sends a read/write signal for distinguishing writing of data and reading of data by a logical bilevel state, an address/data signal for distinguishing an address and data by a logical bilevel state, and a timing clock pulse for driving a data bus to the IC memory card. The control circuit of the IC memory card is responsive to the read/write signal and address/data signal for setting up a status signal read mode and activating the selector, and is responsive to the timing clock pulse for sending the instantaneous address from the plurality of address counters to the host via the selector.

In addition, in accordance with the present invention, an IC memory card for selectively writing or reading data in or out of a semiconductor memory incorporated therein by sequentially incrementing an address sent from a host and made up of a plurality of blocks within the IC memory card comprises: a plurality of address counters for each storing one of the plurality of blocks constituting the address, and for outputting an address for accessing the semiconductor memory by incrementing the block; a control circuit for selectively controlling writing or reading of data in response to control signals indicative of writing or reading of data or for setting of an address sent from the host; and a selector controlled by the control circuit for selectively sending to the host an address from the plurality of address counters or data read out of the semiconductor memory.

BRIEF DESCRIPTION OF THE DRAWINGS

The objects and features of the present invention will become more apparent from the consideration of the following detailed description taken in conjunction with the accompanying drawings in which:

FIG. 2 is a list showing specific terminals assigned to an interface connector included in the embodiment;

FIG. 3 is a table representative of a relation between the logical states of control signals and modes to be set up thereby which are particular to the embodiment;

FIG. 7 is a table representative of a relation between the logical states of control signals and modes to be set up thereby which are particular to the alternative embodiment;

DESCRIPTION OF THE PREFERRED EMBODIMENTS

Figure 1:
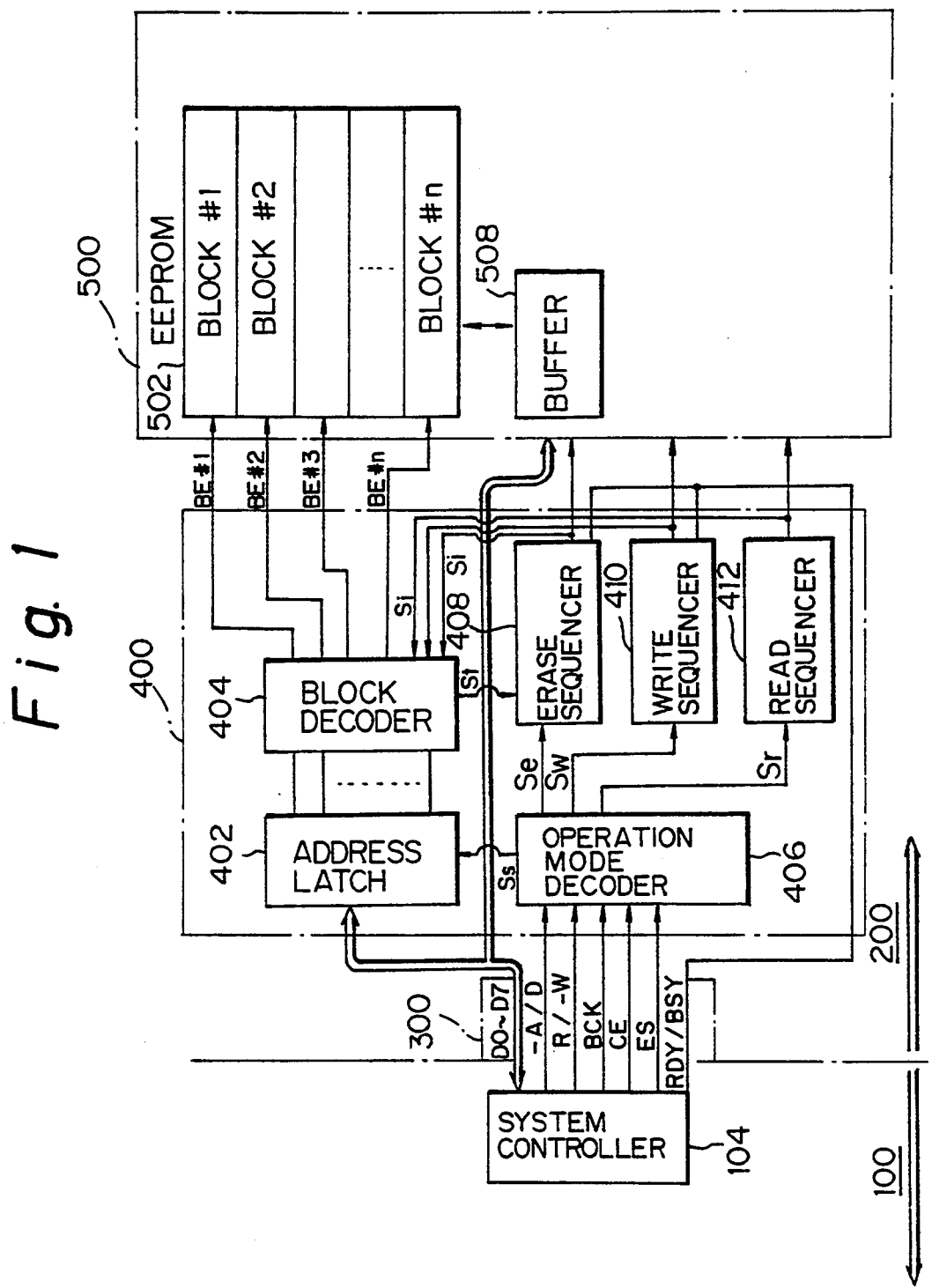
FIG. 1 is a block diagram schematically showing an IC memory card system embodying the present invention.

Referring to FIG. 1 of the drawings, an IC memory card system embodying the present invention is shown and includes an electronic still camera or similar host processing unit 100. An IC memory card 200 is removably connected to the host processing unit 100 (or simply host 100 as referred to hereinafter), and has a main memory implemented by an EEPROM. Picture data or similar data are selectively written to or read out of the memory card 200 under the control of the host 100. The host 100 has a system controller 104 which controls the entire system for writing or reading data in or out of the memory card 200. In FIG. 1, only part of the host 100 relating to the illustrative embodiment is shown for the sake of simplicity. The memory card 200 is generally made up of an interface connector 300, a control circuit 400, and a storage 500 including an EEPROM as a semiconductor memory. The interface connector 300 is removably connected to the system controller 104 of the host 100. The control circuit 400 writes or reads data in or out of the storage 500 under the control of the system controller 104.

The system controller 104 of the host 100 writes data generated by the host 100 in the memory card 200 or reads them out of the memory card 200, as needed. For this purpose, the system controller 104 generates control signals for writing or reading such data and sends them to the memory card 200 via the connector 300. Particularly, in the illustrative embodiment, the system controller 104 generates an erase signal ES and sends it to the memory card 200 for erasing data stored therein. Specifically, connected to a bidirectional bus D0–D7 included in the connector 300, the system controller 104 delivers an address to the memory card 200 while interchanging data and, in addition, delivers the number of blocks to erase to the card 200. Also included in the connector 300 and connected to the system controller 104 are control lines −A/D, R/−W, BCK, CE, ES, and RDY/BSY. The system controller 104 sends an address/data signal over the control line −A/D, a data read/write signal over the control line R/−W, a data or address timing signal over the control line BCK, a card enable signal over an control line CE, and the erase signal over the control line ES, while receiving a signal indicative of the state of the memory card 200 over the control line RDY/BSY. Specifically, as shown in FIG. 3, the system controller 104 is capable of selectively setting up an address set mode, a data write mode, a data read mode or an erase mode. In the address set mode, the system controller 104 causes the control lines −A/D, R/−W and ES to go low ("0" in FIG. 3) and then delivers an address to the common bus D0–D7 in response to the timing clock signal appearing on the control line BCK. In the embodiment, an address is represented by twenty-four bits and is divided into a higher, a medium and a lower address, each having eight bits. In the data write mode, the system controller 104 causes the control line −A/D to go high ("1" in FIG. 3) while causing the control lines R/−W and ES to go low and then sends data to the bus D0–D7 in response to the timing clock signal on the control line BCK. In the data read mode, the system controller 104 causes the control lines −A/D and ES to go high while causing the control line R/−W to go low and then delivers the desired number of blocks to erase in response to the timing clock signal on the control line BCK. The number of blocks to erase is represented by sixteen bits divided into a higher and a lower byte and sent over the data bus D0–D7.

The connector 300 of the memory card 200 receives the control signals and data from the system controller 104 by using a 20-pin I/O bus interface shown in FIG. 2. The interface of FIG. 2 is identical with the interface proposed by the previously mentioned "IC MEMORY GUIDELINE", except for terminal Nos. 14–17 to which the discrimination signals particular to the embodiment are applied. Specifically, the connector 300 includes: two ground terminals (Nos. 1 and 20); data terminals Nos. 2–9 connected to the bidirectional bus D0–D7 to which the eight bits of the address, data or number of blocks to erase are applied in parallel, a logical power source terminal No. 10 to which a 5 volt DC voltage (Vcc) for reading data is applied from the host 100; a program power source terminal No. 11 to which a 12 volt voltage (Vpp) for writing and erasing data is applied; a status terminal No. 12 to which a signal RDY/−BUSY is fed to indicate whether or not processing is under way within the card 200; and a card enable terminal No. 13 for enabling the card 200. The connector 300 also includes an address/data terminal No. 14 to which the address/data signal −A/D is applied; a read/write terminal No. 15 to which the read/write signal R/−W is applied; a clock terminal No. 16 to which the timing clock signal BCK is applied; and an erase terminal No. 17 to which the erase signal ES is applied. The connector 300 further includes reserve terminal Nos. 18 and 19 which are idle in the illustrative embodiment. By contrast, in JEIDA's GUIDELINE, the terminal Nos. 14 and 15 are used as state terminals A0 and A1 for distinguishing data and address while the terminal Nos. 16 and 17 are used as a read terminal RD and a write terminal WR, respectively.

Referring again to FIG. 1, the storage 500 of the memory card 200 is made up of a block erasure type EEPROM playing the role of a main memory, and a buffer 508 for temporarily storing data to be written to or read out of the EEPROM 502. Implemented by a small capacity SRAM, for example, the buffer 508 allows data to be written to or read out of the EEPROM 502 therethrough eight bits at a time. The EEPROM 502 has a plurality of blocks or cells #1 to #n, each being the minimum unit of data erasure and having a capacity of, for example, eight kilobytes. As the control circuit 400 sequentially designates the addresses of any of the blocks or cells #1 to #n, data are written to or read out of the designated blocks on a block basis with the address sequentially incremented eight bits at a time. A sequence for writing or reading data in or out of the EEPROM 502 is executed by a command from a write sequencer 410 or a read sequencer 412 included in the control circuit 400. An erase sequencer 408 is also included in the control circuit 400 for erasing, in the previously mentioned data write mode, old data stored in the EEPROM 502 before new data is written.

An address latch 402 made up of a plurality of registers, an address decoder 404 and an operation mode decoder 406 are further included in the control circuit 400. As an address represented by a plurality of bytes is sent from the host 100 to the control circuit 400 over the bus D0–D7 of the connector 300, the registers of the address latch 402 latch the address byte by byte. Also, when data stored in any of the blocks or cells #1 to #n of the EEPROM 502 are to be erased, the registers of the address latch 402 latch the number of blocks to erase. Specifically, the address latch 402 has a first to a third address register each for latching eight bits of a 24-bit address, and a fourth and a fifth register for latching eight of sixteen bits representative of the number of blocks to erase each. The address and the number of blocks to erase are transferred from the address latch 402 to the block decoder 404.

On receiving the address from the address latch 402, the block decoder 404 decodes it and then produces one of enable signals BE#1 to BE#n meant for one of the the blocks #1 to #n of the EEPROM 502 which is designated by the address. In the illustrative embodiment, the block decoder 404 includes a counter for sequentially incrementing the address eight bits at a time from the first address latched by the address latch 402, thereby sequentially accessing the addresses block by block. When data stored in any of the blocks #1 to #n are to be erased, the block decoder 404 sequentially counts the first address and successive addresses until the number of blocks latched in the address latch 402 has been reached, thereby accessing the blocks to erase. As the number of blocks to erase is reached, the block decoder 404 sends a stop signal St to the erase sequencer 408.

As the host 100 sends a control signal to the operation mode decoder 406 via the connector 300, the decoder 406 conditions the various sections of the memory card 200 for one of the previously mentioned address set mode, data write mode, data read mode, and erase mode (see FIG. 3). Namely, in the address set mode, the operation mode decoder 406 delivers a select signal Ss to the address latch 402 for causing it to activate the first to third registers. As a result, the first to third registers latch the address sent from the host 100. In the data write mode, the operation mode decoder 406 feeds a write mode signal Sw to the write sequencer 410 for driving it. In the data read mode, the operation mode decoder 406 feeds a read mode signal Sr to the read sequencer 412. Further, in the erase mode, the operation mode decoder 406 delivers a select signal Ss to the address latch 402 for activating the fourth and fifth registers, thereby causing them to latch the number of blocks to erase. At the same time, the decoder 406 feeds an erase mode signal Se to the erase sequencer 408 for activating it.

More specifically, assume that each the address/data signals $-A/D$, the read/write signal $R/-W$ and the erase signal ES are in a low level, setting up the address set mode. Then, on receiving the timing signal BCK from the host 100, the operation mode decoder 406 delivers the select signal Ss to the address latch 402 for activating the first to third registers one after another. In the erase mode, wherein the address/data signal $-A/D$ and erase signal ES are in a high level and the read/write signal $R/-W$ is in a low level, the decoder 406 delivers the select signal Ss to the address latch 402 in response to the timing signal BCK, thereby sequentially activating the fourth and fifth registers. Then, the fourth and fifth registers latch the number of blocks to erase. In the erase mode, the decoder 406 feeds the erase mode signal Se to the erase sequencer 408, as mentioned previously. In the data write mode wherein the address/data signal $-A/D$ is in a high level while the read/write signal $R/-W$ and erase signal ES are in a low level, the decoder 406 sends the write mode signal Sw to the write sequencer 410 in response to the timing clock signal BCK. As both the address/data signal $-A/D$ and the read/write signal $R/-W$ go high after the address has been received, the decoder 406 delivers the read mode signal Sr to the read sequencer 412 in response to the timing clock signal BCK. In this case, the erase signal ES is held in a low level.

On receiving the erase mode signal Se from the operation mode decoder 406, the erase sequencer 408 erases any of the blocks #1 to #n of the storage or memory chip 500. Specifically, in response to the erase mode signal Se, the erase sequencer 408 feeds an erase command to the EEPROM 502 to cause it to erase data stored in any of the blocks #1 to #n designated by the block decoder 404. To erase a plurality of blocks, the erase sequencer 408 delivers a timing signal Si to the block decoder 404 to cause it to sequentially select particular ones of the enable signals BE#1 to BE#n meant for the blocks of interest. As the block decoder 404 counts up the number of blocks to erase, it sends a stop signal St to the erase sequencer 408. In response, the erase sequencer 408 stops feeding the erase command to the EEPROM 502. During the course of erasure, the erase sequencer 408 continuously feeds a busy signal BSY to the RDY/BSY terminal 12.

When the operation mode decoder 406 sends the write mode signal Sw to the write sequencer 410, the sequencer 410 controls the sequence for causing the memory chip 500 to write data therein. Specifically, on receiving the write mode signal Sw, the write sequencer 410 activates the buffer 508 to lodge data sent from the host 100 in the buffer 508. Subsequently, the write sequencer 410 delivers a write command to the EEPROM 502 for causing it to write the data stored in the buffer 508 in a block accessed by the block decoder 404. Then, the write sequencer 410 compares the data written to the block of interest and the data stored in the buffer 508. During the comparison, the write sequencer 410 continuously feeds a busy signal BSY to the RDY/BSY terminal 12 to temporarily reject data from the host 100. On completing the comparison, the write sequencer 412 sends a signal Si to the block decoder 404 for incrementing the address, increments the enable signal by eight bits, and then cancels the busy signal BSY. As the host 100 again sends data and bus signal clock BCK to the control section 400, the write mode is set up again. As a result, the data from the host 100 are written to the EEPROM 502 eight bits at a time, and then the address is incremented. Such a procedure is repeated thereafter until all the data have been written to the EEPROM 502.

The read sequencer 412 controls, on receiving the read mode signal Sr from the operation mode decoder 406, the sequence for causing the memory chip 500 to read data therefrom. Specifically, in response to the read mode signal St, the read sequencer 412 sends a read command to the EEPROM 502 and activates the buffer 508 to read data out of the address designated by the block decoder 404. The read sequencer 412 also delivers the timing signal Si to the block decoder 404 to cause it to sequentially increment the address eight bits at a time.

The operation of the IC memory card system having the above construction will be described together with the data inputting and outputting method particular thereto.

Figure 4:
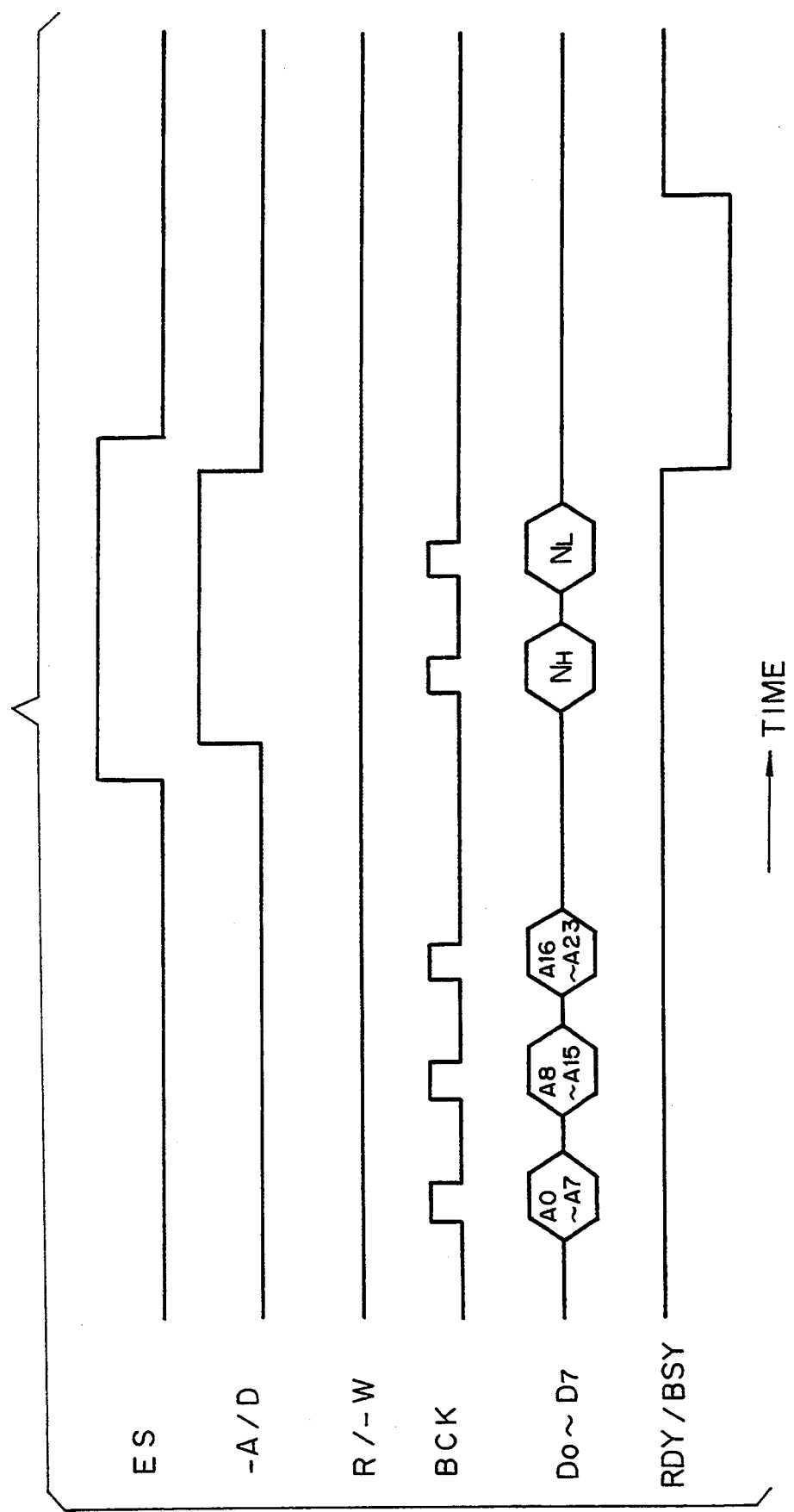
FIG. 4 is a timing chart demonstrating a specific data erasing operation of the embodiment.

The operator of the electronic still camera or similar host 100 couples the connector 300 of the memory card 200 to the system controller 104 of the host 100 and then manipulates the host 100 in a predetermined manner. To begin with, before writing data in the memory card 200, the system erases data stored in designated one or ones of the blocks or cells of the EEPROM 502, as follows. As shown in FIG. 4, the system controller 104 of the host 100 sequentially sends an address represented by, for example, twenty-four bits to the memory card 200 byte by byte. At this instant, the system controller 104 sends an address/data signal $-A/D$ to the terminal 14 of the connector 300 in a low level, sends a read/write signal $R/-W$ to the terminal 15 in a low level, and sends an erase signal ES to the terminal 17 in a low level. These control signals are applied to the operation mode decoder 406 via the connector 300. As a result, the operation mode decoder 406 is conditioned for the address set mode and awaits a bus clock pulse BCK from the system controller 104. As the system controller 104 sends a higher 8-bit address signal A0–A7 to the latch 402 via the bidirectional bus D0–D7 and the first bus clock pulse BCK to the operation mode decoder 406, the decoder 406 feeds a select signal Ss to the address latch 402 for activating the first register thereof. Consequently, the higher 8-bit address A0–A7 is latched in the first register of the address latch 402.

While the above-stated control signals are each held in the address set mode state, the system controller 104 sends the middle 8-bit address A8–A15 together with the second bus clock pulse BCK. Then, the operation mode decoder 406 again delivers a select signal Ss to the data latch 402 for activating the second register thereof. Consequently, the middle 8-bit address signal A8–A15 is latched in the second register. Thereafter, the system controller 104 sends the lower 8-bit address signal A16–A23 together with the third bus clock pulse while maintaining the control signals in the address set mode state. The lower 8-bit address A16–A23 is latched in the third register of the address latch 402 in the same manner as the previous 8-bit addresses. The higher, middle and lower addresses so latched in the three registers of the address latch 402 are transferred to the block decoder 404. The block decoder 404 decodes the addresses and then feeds an enable signal BE#1 (BE#2 to BE#n) to the EEPROM 502.

Subsequently, the system controller 104 causes the address/data signal $-A/D$ and erase signal ES to go high while maintaining the read/write signal $R/-W$ in a low level. As a result, the operation mode decoder 406 is conditioned for the erase mode and awaits a bus clock pulse BCK. Then, the system controller 104 sends the higher byte $N_H$ of the number of blocks to decode to the address latch 402 over the bidirection bus D0–D7 while sending a bus clock pulse BCK to the operation mode decoder 406. On receiving the bus clock pulse BCK, the operation mode decoder 406 feeds a select signal Ss to the address latch 402 for activating the fourth register thereof, thereby latching the higher byte $N_H$ of the number of blocks in the latch 402. Subsequently, the system controller 104 sends a lower byte $N_L$ of the number of blocks to erase to the address latch 402 while sending a bus clock pulse BCK to the operation mode decoder 406. In response, the operation mode decoder 406 again sends a select signal Ss to the address latch 402 for activating the fifth register, thereby latching the lower byte $N_L$ in the fifth register. The number of blocks so latched in the address latch 402 is also transferred to the block decoder 404.

Thereafter, the system controller 104 causes the address/data signal $-A/D$ and erase signal ES to go low and then awaits the erasure of data to occur in the memory card 200. On detecting the negative-going edge of the address/data signal $-A/D$ and that of the erase signal ES, the operation mode decoder 406 delivers an erase mode signal Se to the erase sequencer 408. In response, the erase sequencer 408 sends a busy signal BSY to the host 100 via the connector 300 so as to inform the system controller 104 of the erasure under way. This causes the system controller 104 to stop accessing the memory card 200 for a moment. The erase sequencer 408 feeds the first erase command to the EEPROM 502 to erase the data stored in the block designated by the block decoder 404. Subsequently, the erase sequencer 408 delivers a timing signal Si to the block decoder 404 to cause it to feed an enable signal meant for the next block to the EEPROM 502, and then delivers an erase command to the EEPROM 502 to erase the data stored in the next block. At this instant, the block decoder 404 compares the number of timing signals Si fed thereto with the number of blocks to erase latched in the address latch 402. The erase sequencer 408 repeats the above procedure until the number of timing signals Si fed to the block decoder 404 and the number of blocks to erase compare equal, thereby sequentially erasing the data of the designated blocks of the EEPROM 502. As the erasure of data is completed, the block decoder 404 determines that the number of timing signals Si is coincident with the number of blocks to erase. Then, the block decoder 404 feeds a stop signal St to the erase sequencer 408. As a result, the erase sequencer 408 stops sending the erase command and cancels the busy signal BSY having been sent to the system controller 104.

On the cancellation of the busy signal BSY, the host 100 starts sending data to the memory card 200 one byte at a time. Specifically, the system controller 104 causes the address/data signal −A/D to go high while maintaining the read/write signal R/−W and erase signal ES in a low level, thereby conditioning the memory card 200 for the data write mode. In response, the operation mode decoder 406 feeds a write mode signal Sw to the write sequencer 410 to activate it. Then, the write sequencer 410 turns on the buffer 508, writes the first eight bits of data sent from the host 100 in the buffer 508, and then delivers a write command to the EEPROM 502. As a result, the eight bits of data stored in the buffer 508 are written to a desired address location of the EEPROM 502. Subsequently, the write sequencer 410 verifies the data newly written to the EEPROM 502 and, on determining that the data have been correctly written, sends a timing signal Si to the block decoder 404 to increment the address. At this instant, the write sequencer 410 cancels a busy signal BSY having been sent to the system controller 104. The host 100, therefore, sends the next eight bits of data to the memory card 200. The write sequencer 410 is again brought into the write mode for writing the eight bits of data in an EEPROM cell 502 designated by the next address. Such a sequence of steps is repeated until a predetermined amount of data has been written to the EEPROM 502.

In the data read mode for reading data out of the memory card 200, the host 100 sends a 24-bit address signal to the block decoder 404 via the address latch 402, as in the data write mode. Then, the read sequencer 412 sequentially reads data out of addresses sequentially designated by the block decoder 404.

As stated above, in the illustrative embodiment, the system controller 104 built in the host 100 changes the logical levels of the address/data signal −A/D, read/-write signal R/−W and erase signal ES to condition the memory card 200 for one of the address set mode, data write mode, data read mode, and data erase mode, thereby causing the card 200 to execute the mode selected. Particularly, since the embodiment causes the host 100 to send an erase command and the number of blocks to erase to the memory card 200, the card 200 does not have to make decision on the erasure of data within itself, thereby reducing the load on the control circuit 400. Regarding the erasure of data, the embodiment does not assign the decision to simple logic using only the erase terminal ES. Specifically, the embodiment sets an address, sets the number of blocks to erase when the erase terminal ES and address/data terminal −A/D go high, and then determines, when the terminals ES and −A/D go low, that data have been erased. By so defining the data erasure as a sequence of such steps, it is possible to protect valuable data stored in the memory card 200 from erasure ascribable to the operator's careless or accidental operation of the host 100. Further, the embodiment reduces the conventional two state terminals A0 and A1 and independent write terminal WR and read terminal RD to three terminals, i.e., the address/data terminal −A/D, read/write terminal R/−W, and clock terminal BCK, and uses the resulting idle terminal as the erase terminal ES. This allows an erase command to be sent to the memory card 200 from the outside without increasing the number of pins conventionally given to the interface connector.

In the illustrative embodiment, the memory card 200 sends a busy signal BSY to the host 100 in the event of erasure. Alternatively, since the system controller 104 knows the duration of erasure beforehand in terms of the number of blocks to erase, it may await a given period of time associated with the number of blocks to erase and again access the memory card 200. Further, when data are to be written after the erasure, the embodiment determines the destination of the data on the basis of the erase address, i.e., without causing the system controller 104 to send the destination address to the memory card 200. Alternatively, the system controller 104 may condition the memory card 200 for the address set mode before sending data and then send an address to the card 200.

Figure 5:
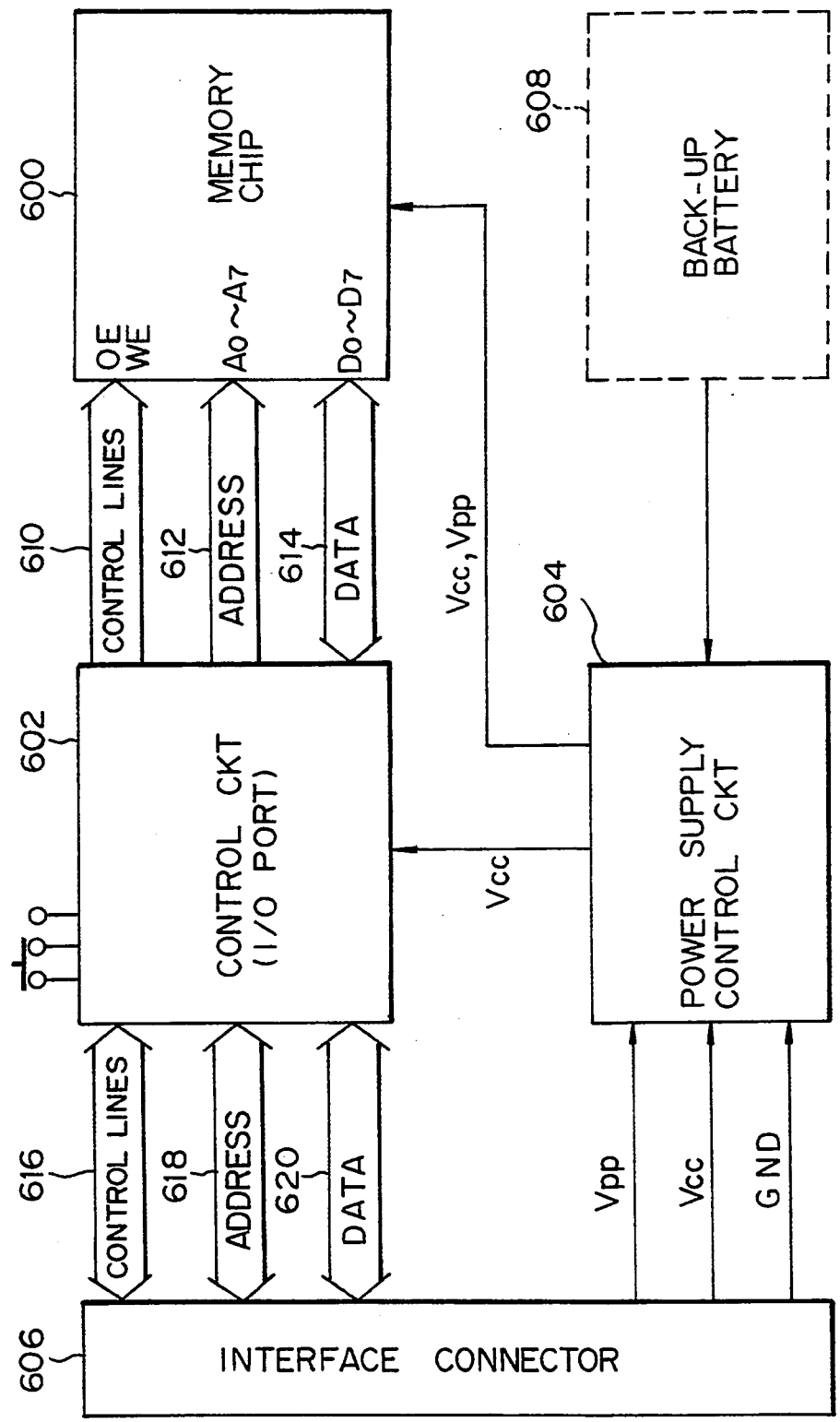
FIG. 5 is a block diagram schematically showing an IC memory card representative of an alternative embodiment of the present invention.

Referring to FIG. 5 of the drawings, there is shown an alternative embodiment of the IC memory card system, particularly an IC memory card, in accordance with the present invention. As shown, the IC memory card is generally made up of a memory chip 600, a control circuit or input/output (I/O) port 602, a power supply control circuit 604, and an interface connector 606. The control circuit 602 controls the operation for writing or reading data in or out of the memory chip 600. The power supply control circuit 604 applies a particular voltage to each of the memory chip 600 and control circuit 602. The interface connector 600 (or simply connector 606 as referred to hereinafter), is removably connected to a host, e.g., an electronic still camera or a personal computer, not shown. The reference numeral 608 designates a back-up battery which will be mounted on the memory card when the memory chip 600 is implemented as an SRAM.

In this embodiment, the memory chip 600 is constituted by an EEPROM, SRAM or similar semiconductor memory. The memory chip 600 has an output enable terminal OE, a write enable terminal WE and other control terminals for receiving various control signals over a control line 610, a 32-bit input terminal implemented as address terminals A0–A31 which are connected to an address line 612, and data terminals D0–D7 connected to an 8-bit bidirectional data bus 614. Data are written to or read out of a particular address location of the memory chip 600 designated by an address fed to the address terminals A0–A31. One byte of data is written or read at a time via the data terminals D0–D7. The write-in and read-out of data are respectively allowed when the write enable terminal WE is in a high level and when the output enable terminal OE is in a high level. The power supply control circuit 604 applies to the memory chip 600 a drive voltage Vcc of 5 volts and, when the chip 600 is implemented by an EEPROM, a program voltage Vpp of 12 volts. In the case of an EEPROM, the drive voltage Vcc is used to read data out of the memory chip 600 while the program voltage Vpp is used to erase and write data in the chip 600. When an SRAM is used as the memory chip 600, data will be written and read out only by the drive voltage Vcc.

As the host sends control signals and an address to the memory chip 600 via the connector 606, the control circuit 602 writes or reads data in or out of the chip 600. The voltage Vcc of 5 volts is also applied to the control circuit 602 from the power supply control circuit 604. The control circuit 602 is connected to the memory chip 100 by the control line 610, address line 612 and data bus 614 and connected to the connector 606 by a control line 616, an address line 618, and a data bus 620. In the illustrative embodiment, the address line 618 and data bus 620 are implemented as an 8-bit common bus.

Figure 6:
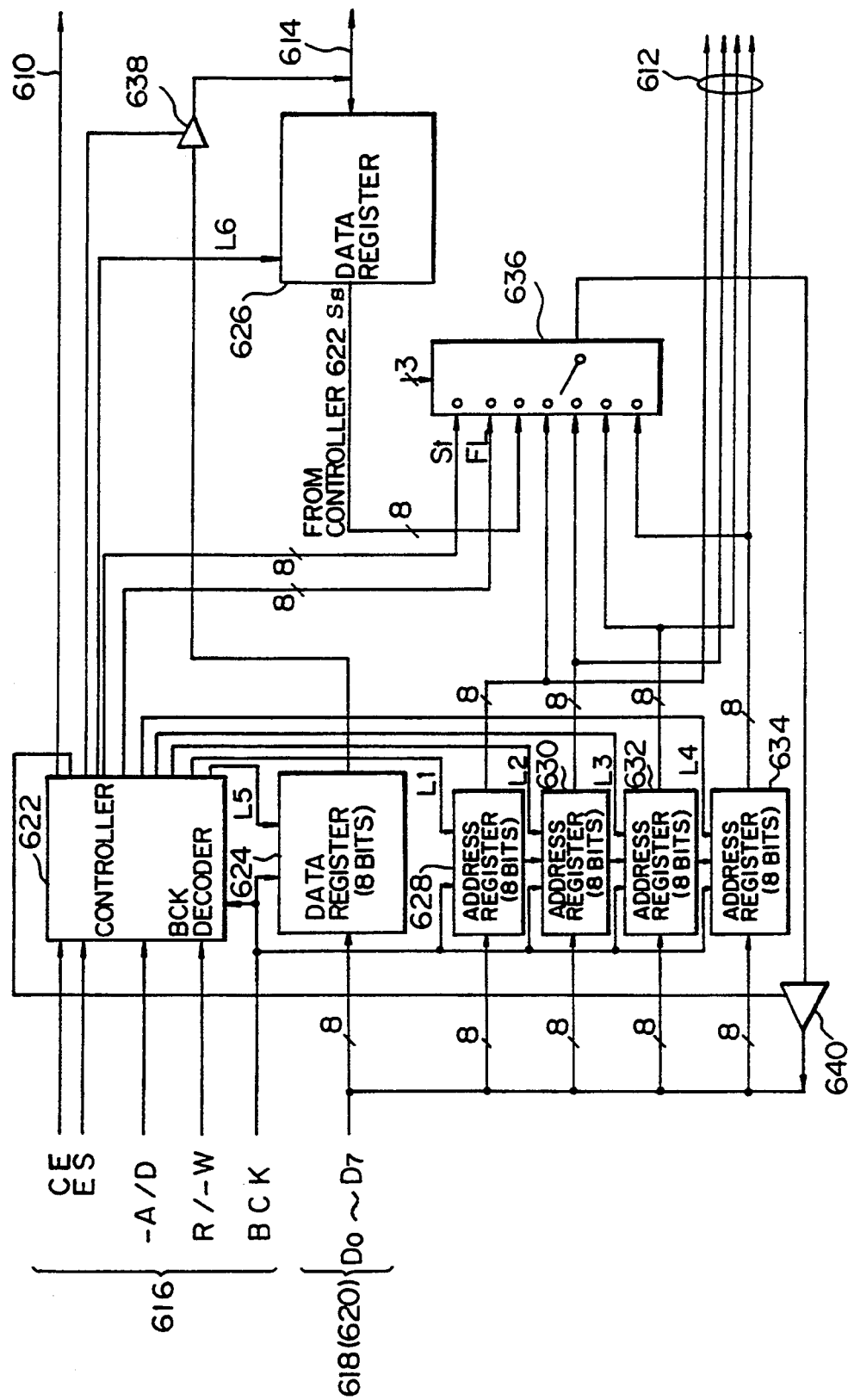
FIG. 6 is a schematic block diagram showing a specific construction of a control circuit built in the memory card of FIG. 5.

Specifically, as shown in FIG. 6, the control circuit 602 has a controller 622, a data register 624 provided at the input side, a data register 626 provided at the output side, four address registers 628, 630, 632 and 634 each having a capacity of eight bits, a selector 636, and two tristate buffers 638 and 640. The controller 622 receives a card enable signal CE, an erase signal ES, an address-/data signal —A/D, a read/write signal R/—W and a timing clock pulse BCK over the control line 616 connected to the connector 606. In response, the controller 622 controls the various blocks of the circuit 602 to write or read data in or out of the memory chip 600, as follows. As shown in FIG. 7, when the address/data signal —A/D and read/write signal R/—W both are in a low level ("0" in FIG. 7), the controller 622 sets up an address set mode and controls the address registers 628-634. When the read/write signal R/—W goes high ("1" in FIG. 7) while the address/data signal —A/D is in a low level, the controller 622 sets up a status signal read mode and controls the selector 636. As the address-/data signal —A/D goes high while the read/write signal R/—W is in a low level, the controller 622 sets up a data write mode and controls the data register 624 on the input side and memory chip 600. Further, when the address/data signal —A/D and read/write signal R/—W both go high, the controller 622 sets up a data read mode and controls the memory chip 600, data register 626 on the output side, selector 636, etc.

In detail, as shown in FIG. 6, the controller 622 starts up on receiving a card enable signal CE over the control line 616, i.e., when the signal CE goes high. Then, in the address set mode, the controller 622 sequentially generates load signals L1-L4 for activating the address registers 628-634, respectively, in response to consecutive timing clock pulses or bus clock pulses BCK. In the data write mode, the controller 622 generates a signal L5 for activating the data register 624 on the input side in response to the bus clock pulse BCK, a signal for turning on the tristate buffer 638, and a write enable signal WE for allowing data to be written to the memory chip 600. The signal WE appears on the control line 610. In the data read mode, the controller 622 produces an output enable signal OE in response to the bus clock pulse BCK on the control line 610, a signal L6 for activating the data register 626 on the output side, and a signal for turning on the tristate buffer 640. Further, in the status signal read mode, the controller 622 generates a control signal Ss for switching the selector 636 in response to the bus clock pulse BCK. In this mode, a status signal St indicative of the kind, capacity and so forth of the memory chip 600, an error flag FL and so forth are sent from the controller 622 to the host via the selector 636. Specifically, in the embodiment, the controller 622 includes a fixed information generating section for generating the status signal St and which may be implemented by a combination of a decoder and logic circuit or a combination of counter and a ROM. The error flag FL is indicative of the result of comparison, or verification, of data in the data write mode, a write error, etc.

The address registers 628-634 are constituted by 8-bit registers, and each delivers a carry signal to the higher register next thereto. The address registers 628-634, therefore, constitute an address counter in combination. Each of the address registers 628-634 receives the bus clock pulse BCK at a clock terminal BCK thereof and receives an address signal over the data common data bus 618 (620). As a load terminal L1, L2, L3, L4, respectively, included in each of the address registers 628-634 goes high, the address register transfers the address signal latched therein to the memory chip 600. Specifically, the first address register 628 latches the first eight bits of the address signal and transfers them to the address terminals A0-A7 of the memory chip 600 and the selector 636. The second register 630 latches the second eight bits of the address signal and delivers them to the address terminals A8-A15 of the memory chip 600 and the selector 636. The third register 632 latches the third eight bits of the address signal and transfers them to the address terminals A16-A23 of the memory chip 600 and the selector 636. Further, the fourth register 634 latches the fourth eight bits of the address signal and transfers them to the address terminals A24-A31 of the memory chip 600 and the selector 636. The address registers 628-634 each increments the address thereof in response to an increment signal (not shown) from the controller 622, thereby accessing the memory chip 600.

Connected to the data bus D0-D7, the data register 624 on the input side stores data received from the host eight bits at a time in response to a bus clock pulse BCK. On receiving a control signal from the controller 622, the data register 624 writes the eight bits of data in the memory chip 600 via the tristate buffer 638. Likewise, the data register 626 on the output side temporarily stores data read out of the memory chip 600 and delivers them to the selector 636 under the control of the controller 622.

The selector 636 receives the status signal St and error flag FL from the controller 622, receives data read out of the memory chip 600 from the data register 626, and receives count addresses from the address registers 628-634, and selectively sends one of them to the host via the tristate buffer 640, as will be described. Referring again to FIG. 5, the power supply control circuit 604 receives the source voltage Vcc and program voltage Vpp from the host via the connector 606, and applies the voltage Vcc to the control circuit 602 and the voltages Vcc and Vpp to the memory chip 600. The connector 606, like the connector 300 of the previous embodiment, is implemented as the I/O bus interface having twenty pins shown in FIG. 2 and proposed by JEIDA in "IC MEMORY GUIDELINE".

Figure 8:
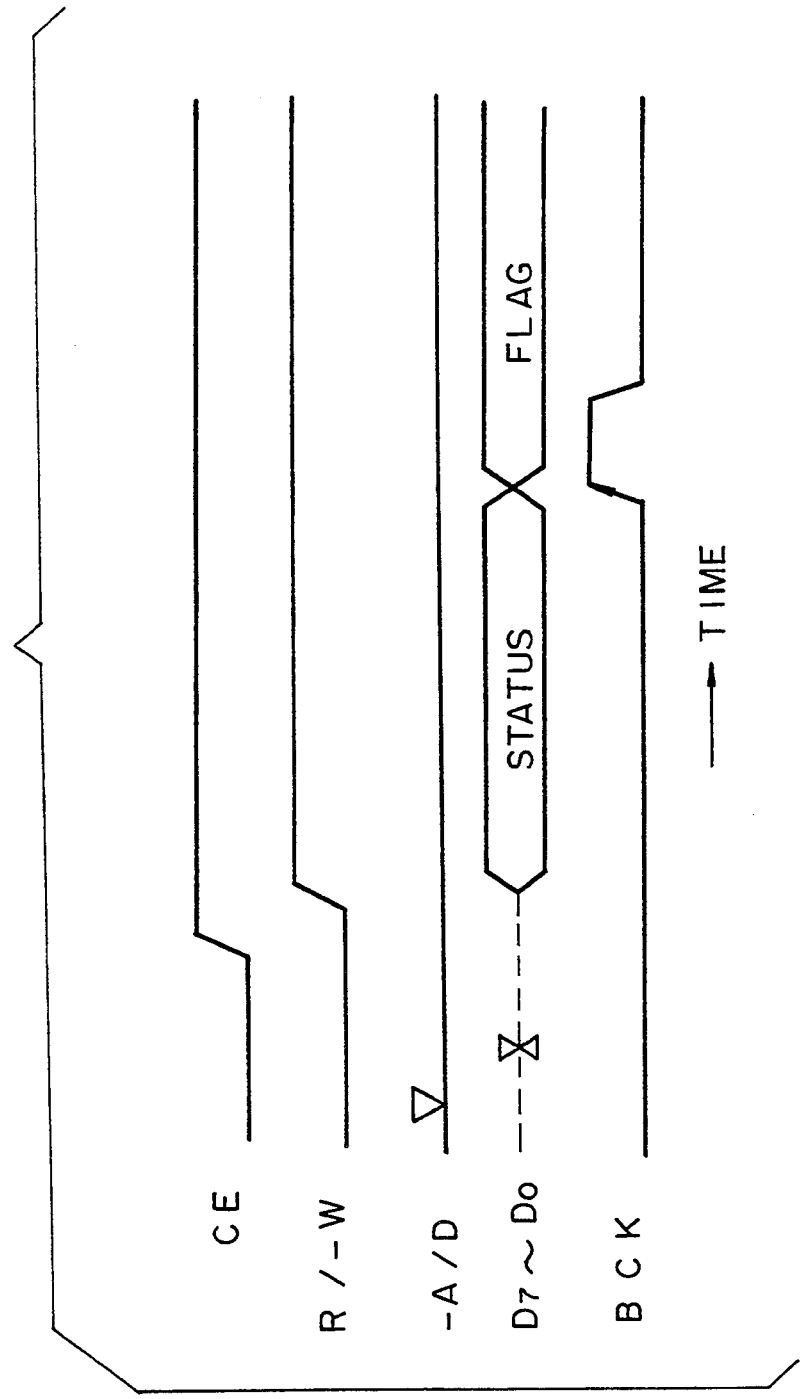
FIG. 8 is a timing chart indicative of part of a status signal read mode to be executed by the alternative embodiment.

The operation of the IC memory card having the above construction will be described with reference to FIGS. 8-12. The operator of the electronic still camera or similar host connects the connector 606 of the memory card to the host and then operates the host in a predetermined manner. Then, the host conditions the memory card for the status read mode in order to determine the kind of the card. Specifically, as shown in FIG. 8, the host processor causes the card enable signal CE and read/write signal R/—W to go high and the address/data signal —A/D to go low. On receiving such CONTROL signals CE, R/—W and —A/D, the controller 622 built in the memory card delivers a status St to the selector 636, switches the selector 636 to cause it to select the status St, and then turns on the tristate buffer 640. As a result, the status St selected by the selector 636 is sent to the host via the buffer 640 and data bus D0-D7. Subsequently, the host sends a bus clock pulse BCK to the controller 622 via the connector 606. In response, the controller 622 causes the selector 216 to select a status flag FL and turns on the tristate buffer 640, thereby sending the status flag FL to the host. Consequently, the host determines the kind, capacity and so forth or the status of the memory card so as to send control signals matching the memory card in the event of writing or reading data. The host, therefore, operates in a particular manner matching the kind or the status of the memory card. For example, assuming that the memory card is implemented by an EEPROM, the host takes account of the data erasing time, verifying time and so forth particular to the EEPROM.

Figure 9:
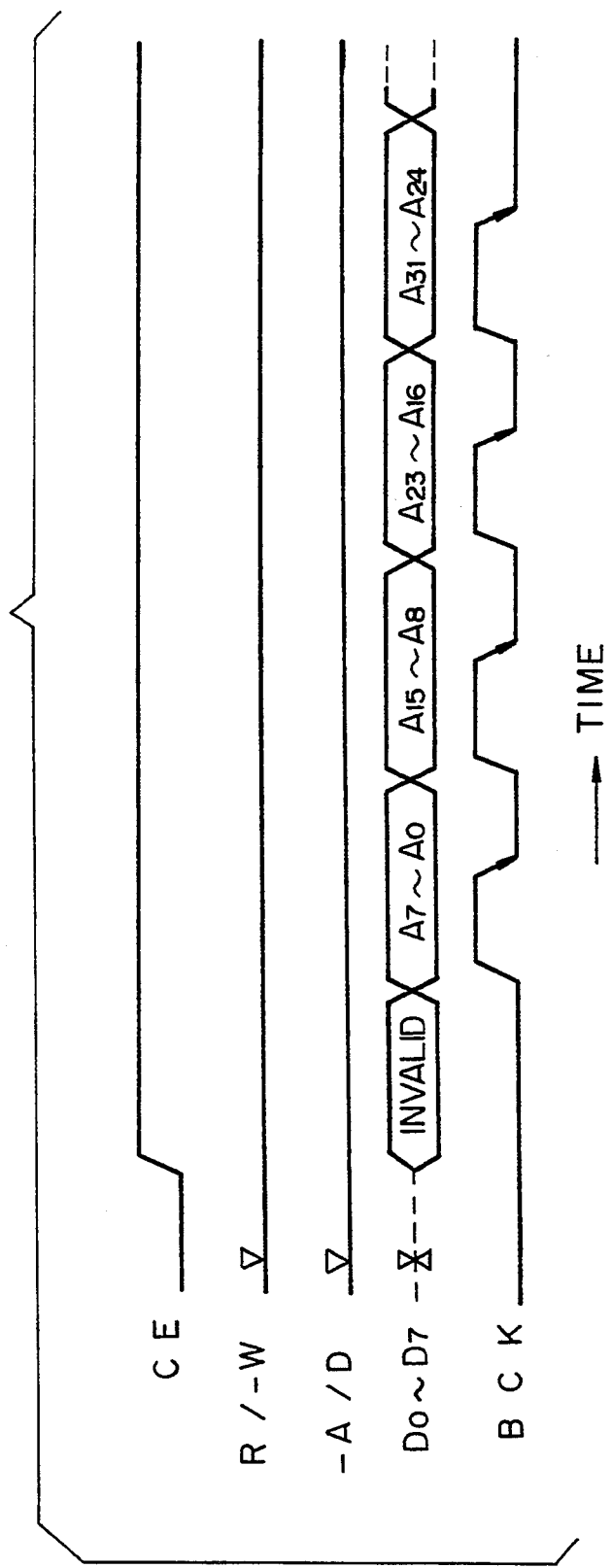
FIGS. 9 and 10 are timing charts representative of an address set mode and a data write mode, respectively, which are particular to the alternative embodiment.

To write data in the memory card, the host processor sends an address designating a particular address location for writing data to the card via the data terminals D0-D7 one byte at a time and, for example, four consecutive times. Specifically, as shown in FIG. 9, the host causes the card enable signal CE to go high while maintaining the address/data signal −A/D and read/-write signal R/−W in a low level. These control signals are coupled to the controller 622 via the terminal 15 (see FIG. 2) and connector 606. In response, the controller 622 sets up the address set mode and then awaits a bus clock pulse BCK. As the host sends the first byte of address signal and the first bus clock pulse BCK to the memory card, the address registers 628-634 latch the first eight bits of addresses A0-A7 therein in response to the bus clock pulse BCK. The controller 622 counts the first bus clock pulse BCK, decodes the count, and then generates a signal L1 for turning on the load terminal of the first register 628. As a result, the first register 628 transfers the first eight bits of the addresses latched therein to the address terminals A0-A7 of the memory chip 600. At the same time, the eight bits from the register 628 are applied to the fourth terminal of the selector 636.

As the host sends the second byte of the addresses and the second bus clock pulse BCK to the memory card, the registers 628-634 latch the second byte of the addresses A8-A15. The controller 622 receives the second bus clock pulse BCK, decodes the count, and then turns on the load terminal L2 of the second register 630. As a result, the second register 630 transfers the second byte to the address terminals A8-A15 of the memory chip 600. At this instant, the second byte (addresses A8-A15 from the register 630) is fed to the fifth terminal (the selector 636. Likewise, as the third byte of the addresses A16-A23) and the third bus clock terminal BCK from the host arrive, the third register 632 latches the addresses A16-A23. The third register 632 transfers the addresses A16-A23 to the address terminals A16-A23 of the memory chip 600 and to the selector 636 under the control (the controller 622. Finally, when the fourth byte of the addresses A24-A31) and the fourth bus clock pulse BCK from the host arrive, the fourth register 634 latches the addresses A24-A31 and then transfers them to the address terminals A2-4-A31 of the memory chip 600 while applying it to the selector 636.

Figure 10:
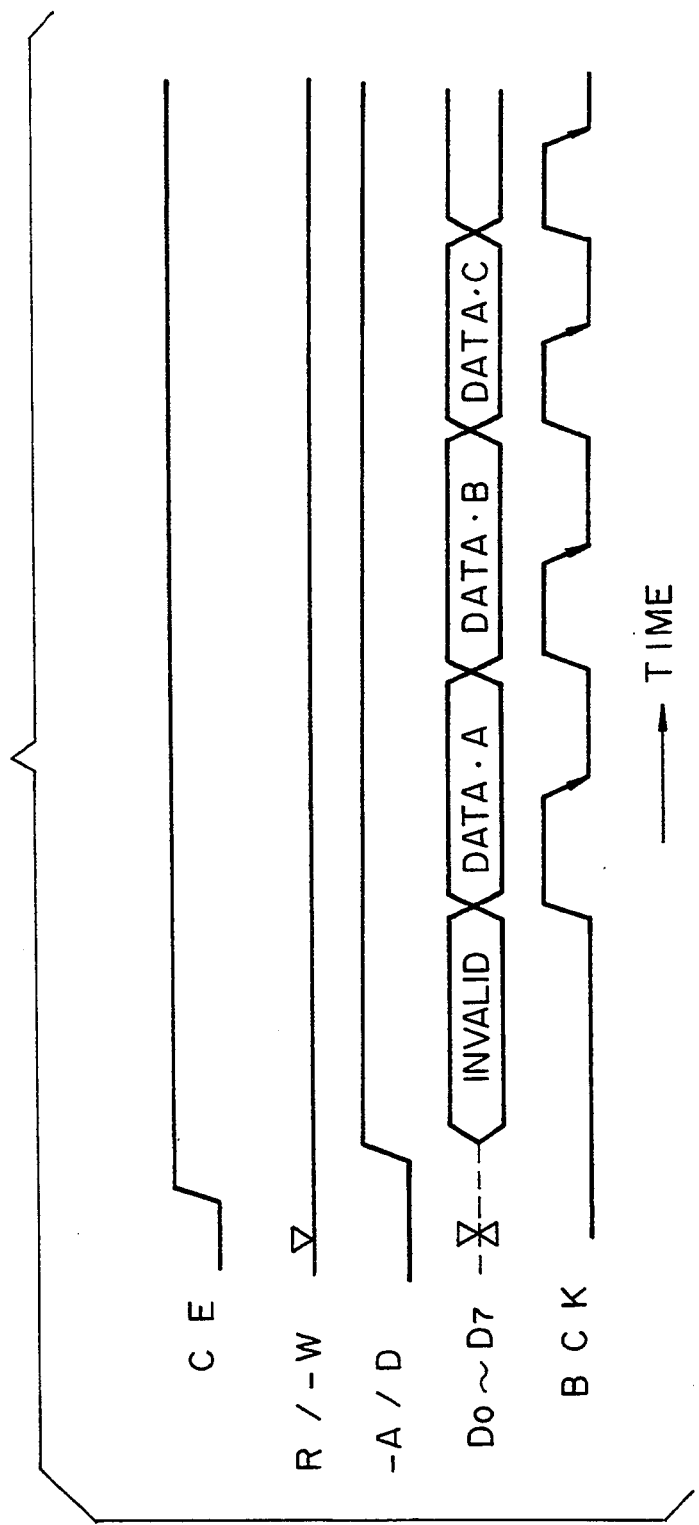

After the host has accessed the first address location of the memory chip 600 by the above-described procedure, it sends data to write to the memory card in synchronism with the bus clock pulses BCK one byte at a time. Specifically, as shown in FIG. 10, the host causes the read/write terminals R/−W and address/data terminal −A/D to go high while maintaining the card enable signal CE in a high level. In response to these control signals, the controller 622 sets up the data write mode and generates a signal L5 for activating the data register 624. As a result, the data register 624 latches the data received over the data bus D0-D7. On receiving the timing clock pulse BCK, the controller 622 turns on the tristate buffer 638 to deliver the data latched by the data register 204 to the memory chip 600 via the buffer 638. Further, the controller 622 generates a signal for causing the write enable terminal WE of the memory chip 600 to go high and feeds it to the terminal WE over the control bus 610. Consequently, the data received via the data terminals D0-D7 are written to the address location of the memory chip 600 which is designated by the previously stated 32-bit address.

Assume that the data have been correctly written to the memory chip 600, e.g., that erasure, write-in and verification have been correctly executed in an EEPROM. Then, the controller 622 increments the address register 628 to cause it to access the next address location of the memory chip 600 for writing the next 8-bit data. The incremented address is also applied to a predetermined terminal of the selector 636. As the host sends 8-bit data and bus clock pulse BCK to the memory card, the controller 622 again causes the data register 624 to latch them and transfer them to the memory chip 600 via the tristate buffer 638. As a result, the 8-bit data are written to the address location of the memory chip 600 designated by the address register 628. Thereafter, the address register 628 is sequentially incremented to write successive data in the memory chip 600 eight bits at a time. When a carry occurs in the address register 628, the address register 630 is incremented. This is also true with the address registers 630, 632 and 634. The resulting values of the address registers 628-634 are each applied to a particular terminal of the selector 636.

Figure 11:
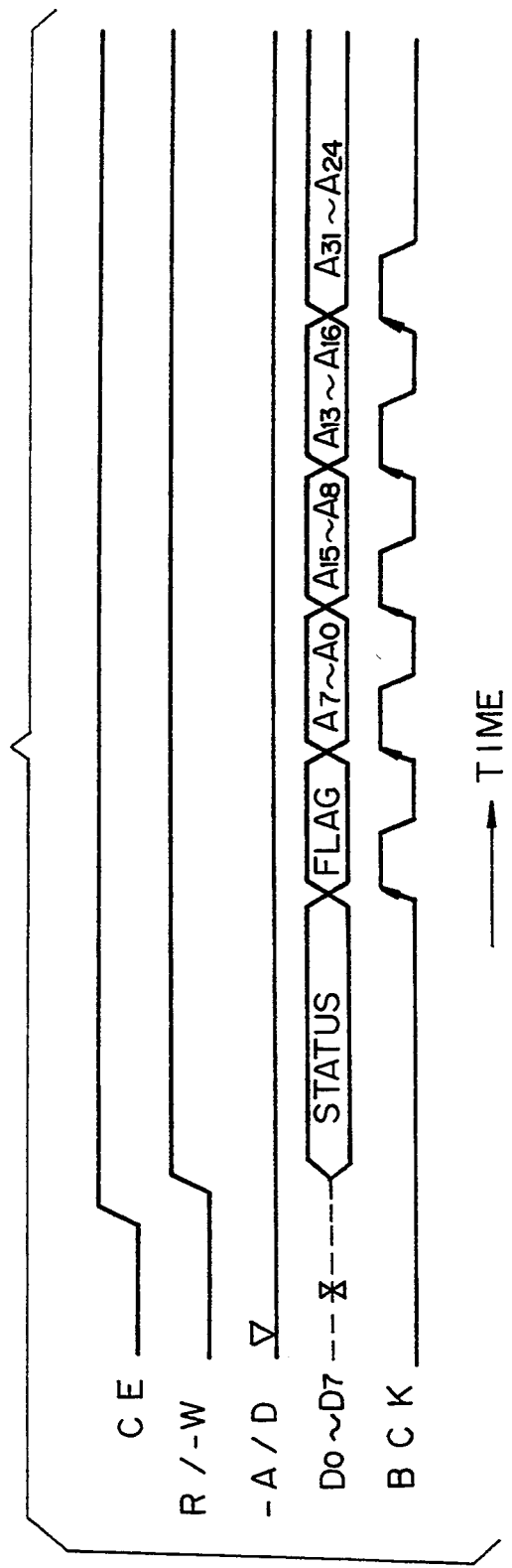
FIG. 11 is a timing chart indicative of the other part of the status signal read mode of the alternative embodiment.

Assume that an error occurs while data are sequentially written to the memory chip 600 as stated above. Then, the duration of, for example, the busy signal RDY/−BUSY (see FIG. 2) being sent to the host increases, allowing the host to detect the error. On determining that a write error has occurred, the host sends control signals for conditioning the memory card for the status read mode to the controller 622. Specifically, as shown in FIG. 11, the host causes the read/write signal R/−W and address/data signal −A/D to go high and low, respectively, while maintaining the card enable signal CE in a high level. In response, the controller 622 sets up the status signal read mode and controls the selector 636 and tristate buffer 640. First, the controller 622 feeds the first control signal to the selector 636 to cause it to select the status signal St from the controller 622. Then, the controller 622 turns on the buffer 640 to send the status signal St to the host via the buffer 640. Thereafter, the host sends the first timing clock pulse BCK to the controller 622 of the memory card. In response, the controller 622 delivers the second control signal to the selector 636 to cause it to select the status flag FL. As a result, the status signal FL is sent to the host via the buffer 640 having been turned on then. On receiving the status signal FL, the host sends the second timing clock pulse BCK to the controller 622. In response, the controller 622 delivers the third control signal to the selector 636 to cause it to select the address A0-A7 from the first address register 628. The address A0-A7 is sent to the host via the selector 636 and buffer 640. In the same manner, the controller 622 causes the selector 636 to sequentially select the address values counted by the second to fourth address registers 630-634. These address values are sent to the host one after another via the buffer 640. As a result, the host can identify the address of the memory chip 600 where the write error has occurred. The host again starts writing data in, for example, the identified address and successive addresses of the memory chip 600 in the manner shown in FIG. 10.

Figure 12:
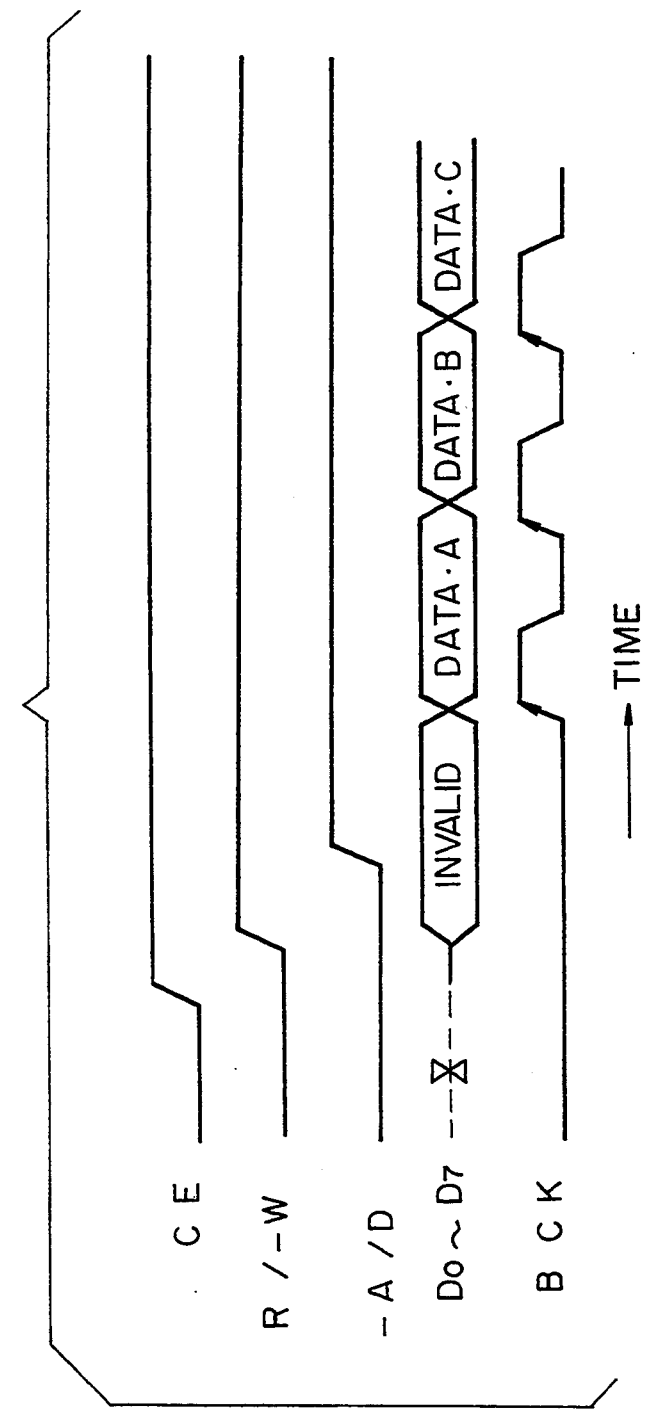
FIG. 12 is a timing chart showing a data read mode to be executed by the alternative embodiment.

In the data read mode, the host executes the address setting procedure described with reference to FIG. 6. Then, the memory card accesses the memory chip 600 on the basis of the address set in the address registers 628–634. Subsequently, as shown in FIG. 12, the host causes the read/write signal R/−W and address/data signal −A/D to go low and high, respectively, while maintaining the card enable signal CE in a high level, and then sequentially sends timing clock pulses BCK to the controller 622 via the connector 606. In response, the controller 622 turns on the output enable terminal OE of the memory chip 600 and then sequentially reads data out of the designated address locations of the chip 600 eight bits at a time. These data are applied to the data register 626 over the data line 614 and then sent to the host via the tristate buffer 640. Again, the controller 622 increments the address register 628 every time eight bits of data are read out of the memory chip 600.

As stated above, the embodiment can write or read data in or out of the memory chip 600 by sending control signals to the terminal Nos. 14–16 of the connector 606 (see FIG. 2) and, therefore, can allocate the terminal No. 17 to the erase signal ES. The erase signal ES is used when the host processor erases data stored in particular addresses of an EEPROM before writing new data therein. Assume that the capacity of the memory chip 600 is increased, and the address location of the memory chip 600 is designated by an address signal having five or more bytes. Then, the embodiment can input and output the address signal and data only if an extra address register or registers matching the number of bytes of the address signal are incorporated in the control circuit 602 in addition to the address registers 628–634. This makes it needless to increase the number of terminals of the connector 606. Moreover, since in the status signal read mode the host can read the access address in the card which has been incremented by the address registers 628–634 via the selector 636, the load on the host processor is reduced. Specifically, when an error occurs in the memory card, the host has only to rewrite the minimum amount of data on the basis of the address read out of the address registers 628–634 of the memory card. Otherwise, the host would have to write the data in the memory card all over again by controlling the address being incremented with, for example, a counter.

In the illustrative embodiment, the status St indicative of the kind and capacity of the memory card is generated in the controller 622. Alternatively, the status may be stored in an independent ROM or in a predetermined address location of the memory chip 600 beforehand and accessed in the status signal read mode.

In summary, in accordance with the present invention, to rewrite data stored in an IC memory card, a host connected to the memory card sends an address/data signal indicative of an address or data, a read/write signal indicative of reading or writing, and an erase signal indicative of erasure to the memory card. In response, the memory card sets an address therein, erases data, writes data, and reads data. Therefore, an IC memory card implemented by a memory of the type erasing data before writing new data does not have to make a decision on the erasure or to generate an erase signal. This simplifies the control to be executed and, therefore, control circuitry built in such a memory card, while enhancing rapid processing. Moreover, the system can erase data efficiency without increasing the conventional number of pins. The host, therefore, can operate with any kind of memory card only by determining the kind of the card and changing control signals. In addition, the system defines data erasure as a sequence including setting an address, changing control signals, and setting the number of blocks to erase, thereby protecting stored data from erasure ascribable to the unexpected manipulation of the host.

Furthermore, in the system of the present invention, the address of the memory card sequentially incremented by an address counter is fed to a selector, as needed. When the host sends a status signal read mode to a controller included in the memory card, the controller causes the selector to select the instantaneous address and send it to the host. Hence, the host can read, in the event of a write error or similar error, the instantaneous address of the memory card and again write data on the basis of the address without resorting to a counter similar to the counter of the card. This realizes an efficient and reliable storage system.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An IC memory card system comprising:
   a host for processing data; and
   an IC memory card removably connected to said host and incorporating a data recording medium implemented by an electrically erasable programmable semiconductor memory;
   said host comprising system control means for sending to said IC memory card an address/data signal for distinguishing an address and data by a logical bilevel state, a read/write signal for distinguishing reading of data and writing of data in said semiconductor memory by a logical bilevel state, and an erase signal for erasing data stored in said semiconductor memory by a logical bilevel state as control signals, and bus clock pulses each being synchronous to a particular address and particular data;
   said IC memory card comprising internal control means responsive to said address/data signal, said read/write signal, said erase signal and said bus clock pulses for distinguishing an address and data, for distinguishing reading and writing, and for determining whether or not to erase existing data, and for then reading or writing data in said semiconductor memory or for erasing said existing data.

2. An IC memory card comprising:
   storing means implemented by a semiconductor memory for storing data;
   control means for selectively writing or reading data in or out of said storing means; and
   inputting and outputting means for removably connecting said control means to a host;
   said inputting and outputting means comprising:
   a common data terminal to which the host selectively sends an address for accessing said storing means and input or output data, or the number of blocks of said storing means to erase;
   an address/data terminal to which the host sends a bilevel signal for distinguishing the address and data and the number of blocks to erase to be applied to said common data terminal;

a read/write terminal to which the host sends a bilevel signal for distinguishing reading of data and writing of data;

an erase terminal to which the host sends a bilevel signal indicative of erasure of data; and a bus clock input terminal to which the host sends bus clock pulses, each being synchronous to a particular address, particular data or the number of blocks to erase.

3. A memory card in accordance with claim 2, wherein said control means comprises:

a plurality of latching means, each for latching a particular block of the address and a particular block of the number of blocks to erase received via said data terminal;

accessing means for accessing particular addresses of said storing means on the basis of the address and the number of blocks to erase latched by said plurality of latching means;

latch activating means for selectively activating said plurality of latching means by reading a logical bilevel state of the signal received via said address/data terminal and a logical bilevel state of the signal received via said erase terminal; and timing control means for feeding an address receive timing and a data write or read timing, or a signal for erasing data to said storing means by reading the bilevel signals received via said address/data terminal, said read/write terminal and said erase terminal, respectively, and the bus clock pulses.

4. A method of inputting and outputting data from an IC memory card incorporating a semiconductor memory which receives an address to access and data to record over a common bus and, before said data are written to said semiconductor memory, has data existing therein erased, said method comprising the steps of:

sending from a host to said IC memory card an address/data signal for distinguishing an address and data by a logical bilevel state, a read/write signal for distinguishing reading of data and writing of data in said semiconductor memory by a logical bilevel state, and an erase signal for erasing data existing in said semiconductor memory by a logical bilevel state and control signals, and bus clock pulses, each being synchronous to a particular address and particular data; and writing or reading data in or out of said semiconductor memory or erasing data of said semiconductor memory by distinguishing an address and data, distinguishing writing of data and reading of data and determining whether or not to erase data on the basis of the bilevel states of the address/data signal, the read/write signal and the erase signal and the bus clock pulses.

5. A method in accordance with claim 4, wherein said semiconductor memory erases a single block of data having a predetermined capacity at a time, said method further comprising the steps of:

sending, when data stored in said semiconductor memory are to be erased block by block, an address of the block whose data is to be erased first and the number of blocks to erase together with the control signals and the bus clock pulses; and sequentially erasing the blocks of said semiconductor memory on the basis of the address and the number of blocks to erase.

6. A method in accordance with claim 5, further comprising the step of causing said IC memory card to send to said host a status signal indicative of data erasure under way while erasing the blocks of said semiconductor memory.

7. A method in accordance with claim 5, further comprising the steps of:

causing said IC memory card to cancel the status signal on completing erasure of the data of the blocks of said semiconductor memory, and sending destination addresses of data to write and said data from said host to said IC memory card together with the control signals and the bus clock pulses, thereby causing said IC memory card to sequentially write said data.

8. An IC memory card system comprising:

a host for processing data; and an IC memory card incorporating a semiconductor memory therein and removably connected to said host for selectively writing or reading, on receiving an address made up of a plurality of blocks from said host, data in or out of said semiconductor memory by sequentially incrementing said address within said IC memory card;

said IC memory card comprising:

a plurality of address counters, each for storing one block of the plurality of blocks constituting the address received from said host, and for accessing said semiconductor memory by sequentially incrementing the block;

control means for controlling writing or reading of data on receiving control signals for writing or reading data or control signals for setting an address form said host; and selecting means for selectively sending to said host the address from said plurality of address counters or the data read out of said semiconductor memory;

said host sending a read/write signal for distinguishing writing of data and reading of data by a logical bi-level state, an address/data signal for distinguishing an address and data by a logical bi-level state, and a timing clock pulse for driving a data bus to said IC memory card;

said control means of said IC memory card being responsive to said read/write signal and said address/data signal for setting up a status signal read mode and activating said selecting means, and being responsive to said timing clock pulse for sending an instantaneous address from said plurality of address counters to said host via said selecting means.

9. An IC memory card for selectively writing or reading data in or out of a semiconductor memory incorporated therein by sequentially incrementing an address sent from a host, said address made up of a plurality of blocks within said memory card, said IC memory card comprising:

a plurality of address counters each of storing one of the plurality of blocks constituting the address, and outputting an address for accessing said semiconductor memory by incrementing the address;

control means for selectively controlling writing or reading of data in response to control signals indicative of writing or reading of data or for setting of an address sent from the host; and selecting means, controlled by said control means, for selectively sending to the host an address from said plurality of address counters or data read out of said semiconductor memory; wherein said control means activates said selecting means on receiving the control signals indicative of reading of data and a timing clock pulse form said host, thereby sending an address from said plurality of address counters to said host via said selecting means.

10. An IC memory card for selectively writing or reading data in or out of a semiconductor memory incorporated therein by sequentially incrementing an address sent from a host, said address made up of a plurality of blocks within said memory card, said IC memory card comprising:

a plurality of address counters each for storing one of the plurality of blocks constituting the address, and outputting an address for accessing said semiconductor memory by incrementing the address;

control means for selectively controlling writing or reading of data in response to control signals indicative of writing or reading of data or for setting of an address sent from the host; and selecting means, controlled by said control means, for selectively sending to the host an address from said plurality of address counters or data read out of said semiconductor memory; wherein the host sends to said memory card a read/write signal for distinguishing writing of data and reading of data by a logical bilevel signal, an address/data signal for distinguishing an address and data, and the timing clock pulse for driving a data bus;

said control means executing control on the basis of said read/write signal and said address/data signal and in response to said timing clock pulse.

11. An IC memory card connectable to a host comprising:

a semiconductor memory having storage locations in which data sent from the host are stored in response to a first address;

a plurality of address counters, each for storing one of a corresponding plurality of blocks constituting a second address sent from the host, and for incrementing the second address to provide said semiconductor memory with a resultant address as the first address;

selecting means for selectively sending to the host the first address contained in said plurality of address counters and the data stored in said semiconductor memory; and control means, operative in response to control signals received from the host, for controlling said semiconductor memory and said selecting means, said control signals being indicative of write in and read out of data to/from said semiconductor memory and setting the second address with respect to said plurality of address counters;

said control means causing, in response to the control signals representing a specific state, said selecting means to send to the host the first address contained in said plurality of address counters.

12. An IC memory card in accordance with claim 11 wherein said semiconductor memory comprises an EEPROM.

13. An IC memory card in accordance with claim 11 wherein said semiconductor memory comprises an SRAM.

14. An IC memory card in accordance with claim 11 wherein the control signals include a first control signal indicative of whether data are to be written in or read out of said semiconductor memory, and a second control signal indicative of whether the second address is to be set in said plurality of address counters or the data is to be stored in said semiconductor memory, the specific state being represented by said first and second control signals.

15. An IC memory card in accordance with claim 11 wherein said control means activates said selecting means upon receiving the control signals indicative of reading of data and a timing clock pulse from the host, thereby causing said selecting means to send the first address from said plurality of address counters to the host.

* * * * *